United States Patent [19]

Gounji et al.

[11] Patent Number: 4,633,204
[45] Date of Patent: Dec. 30, 1986

[54] MECHANICAL FILTER

[75] Inventors: Takashi Gounji, Yokohama; Shinichi Yamamoto, Kawasaki; Teruo Kawatsu, Oyama; Yoshiro Tomikawa, Yonezawa; Masashi Konno, Yonezawa; Toshiharu Ogasawara, Yonezawa, all of Japan

[73] Assignee: Fujitsu Limited, Kawasaki, Japan

[21] Appl. No.: 769,606

[22] Filed: Aug. 26, 1985

[30] Foreign Application Priority Data

Aug. 29, 1984 [JP] Japan .................................. 59-178268
Jan. 28, 1985 [JP] Japan .................................. 60-012617

[51] Int. Cl.⁴ .......................... H03H 9/56; H03H 9/58
[52] U.S. Cl. .................................... 333/186; 310/359; 310/366; 333/189; 333/192
[58] Field of Search .................... 333/186–192; 310/320, 321, 357–359, 365–367, 323, 328, 363, 333, 360–361, 368; 331/154–156, 158, 160, 175

[56] References Cited

U.S. PATENT DOCUMENTS

| 3,736,446 | 5/1973 | Berlincourt et al. ................. 310/359 |
| 4,281,298 | 7/1981 | Gounji et al. ..................... 310/357 X |
| 4,336,510 | 6/1982 | Miyamori ......................... 310/357 X |
| 4,503,352 | 3/1985 | Inoue ................................. 310/359 |
| 4,555,682 | 11/1985 | Gounji et al. ....................... 333/189 |

FOREIGN PATENT DOCUMENTS 0118272 9/1984 European Pat. Off. .

OTHER PUBLICATIONS

"The Journal of the Institute of Electronics and Communication Engineers of Japan", vol. 53-A, No. 4, FIG. 2 on p. 178, published on Apr. 1970.

Primary Examiner—Marvin L. Nussbaum
Attorney, Agent, or Firm—Staas & Halsey

[57] ABSTRACT

A mechanical filter having as its major part at least one longitudinal vibration mode vibrator, includes a piezoelectric ceramic plate an electrode pair attached to top and bottom surfaces thereof. The piezoelectric ceramic plate is polarized in its thickness direction to form at least two polarized regions, the polarization directions being different from each other.

17 Claims, 27 Drawing Figures

MECHANICAL FILTER

BACKGROUND OF THE INVENTION

1. Field of the Invention

The present invention relates to a mechanical filter, more particularly to a mechanical filter including at least one piezoelectric ceramic vibrator.

2. Description of the Prior Art

Mechanical filters are widely used as frequency selection devices which transform electric signals into ultrasonic waves as a transfer medium, and vice versa. Mechanical filters have numerous advantages, such as a high Q compared with coils and capacitors, maintained or increased stability, and compact construction. Because of these advantages, mechanical filters have been used as channel filters for channel translating equipment and as filters for a pulse code modulation (PCM) data transmission equipment used in, for example, the "information network service" (INS) of Japan and the "integrated service data network" (ISDN) now beginning to be constructed in numerous countries around the world.

A mechanical filter is usually fabricated with a vibrator, a coupler, and a support wire. The vibrator is most preferably made of a piezoelectric ceramic material. The prior art piezoelectric ceramic vibrator of the longitudinal vibration mode suffers from two basic problems. First, it exhibits no frequency response characteristics of the even number order modes, e.g., the second and fourth order mode. This means that a mechanical filter using a prior art piezoelectric ceramic vibrator has no filtering function under the second order mode, the fourth order mode, or higher even number order modes.

Second, while the prior art piezoelectric ceramic vibrator exhibits frequency response characteristics of the odd number order modes, e.g., the first, third, or fifth order mode, the frequency response is lower the higher the order. This means that a mechanical filter using a prior art piezoelectric ceramic vibrator has an insufficient filtering function under higher, odd number order modes.

SUMMARY OF THE INVENTION

Accordingly, it is an object of the present invention to provide an improved mechanical filter having at least one piezoelectric ceramic vibrator of a longitudinal vibration mode which can overcome the aforesaid two problems simultaneously.

To attain the above object, the piezoelectric ceramic vibrator of the mechanical filter is composed of a plurality of polarized regions aligned with each other, each two adjacent regions polarized in directions different from each other.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Before describing the embodiments of the present invention, the prior art and the problems therein will be first described in more detail with reference to the related figures.

Figure 1:
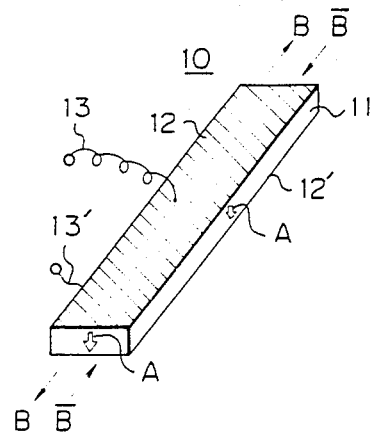
FIG. 1 is a perspective view of a conventional piezoelectric ceramic vibrator of a longitudinal vibration mode.

FIG. 1 is a perspective view of a conventional piezoelectric ceramic vibrator 10 of a longitudinal vibration mode (hereinafter referred to simply as a "longitudinal mode vibrator"). The base is chiefly made of a piezoelectric ceramic plate 11. The piezoelectric ceramic plate 11 is polarized, before being put into actual use, in its thickness direction, as schematically illustrated by arrows A. Polarization is necessary if the ceramic plate 11 is to exhibit linear distortion with respect to the cyclic change of an electric field applied thereto. Metal films 12 and 12' are attached to the top and bottom surfaces of the ceramic plate 11. An AC voltage is applied to the metal films 12 and 12' to create the electric field.

The vibrator 10 is made to vibrate in the longitudinal vibration mode by utilizing the so-called transverse vibration effect, in which the vibrator distorts in a direction B or $\bar{B}$, both perpendicular to the direction in which the aforesaid electric field is created. The arrows B denote elongation, and the arrows $\bar{B}$ denote shrinkage. The AC voltage for inducing the longitudinal vibration mode is supplied via leads 13 and 13'. In this case, the leads 13 and 13' are fixed to the individual metal films 12 and 12' by soldering.

Figure 2:
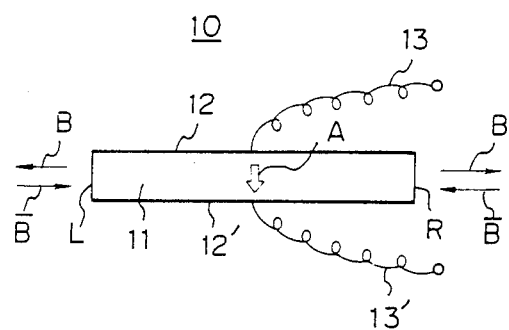
FIG. 2 is a front side view of the longitudinal mode vibrator shown in FIG. 1.

FIG. 2 is a front side view of the longitudinal mode vibrator 10 shown in FIG. 1. Members identical to those in FIG. 1 are represented by the same reference numerals or characters; this also applies to the later figures. The left side end surface L and the right side end surface R of the longitudinal mode vibrator 10 distort along the direction B and $\bar{B}$ alternately.

Figure 3:
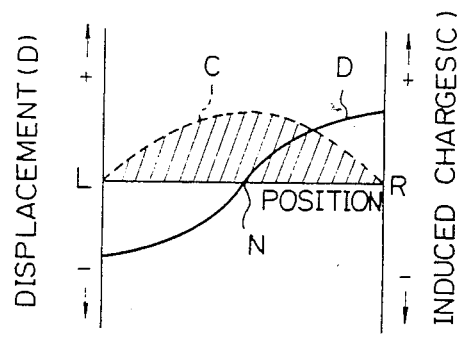
FIG. 3 is a graph representing the relationship between a displacement and induced charges of the longitudinal mode vibrator under the first order mode.

FIG. 3 is a graph representing the relationship between a displacement D and induced charges C of the longitudinal mode vibrator 10 under the first order mode. In FIG. 3, the abscissa indicates the position along the vibrator 10, wherein the characters L and R correspond to the aforesaid left and right side end surfaces, respectively. The direction of the displacement (positive (+) or negative (−)) of the vibrator 10 and the amount thereof at each position are distributed as shown by the solid line curve D. At a certain timing, the left side end surface L deviates to the most negative side, while the right side end surface R deviates to the most positive side. Therefore, a node N of the displacement O exists at the intermediate position between the end surfaces L and R. The node N produces the displacement O, however, the node N is given largest distortion. Thus, the induced charge C appearing on one of the top and bottom surfaces of the piezoelectric ceramic plate 11 becomes maximum at the node N, as shown by the broken line curve C. On the other hand, both the left and right side end surfaces L and R produce maximum negative and positive displacements, however, each produces a distortion of O. Therefore, the charge to be induced is also O. In this case, from the viewpoint of the electric potential, the electric potential induced on each of the top and bottom surfaces is the same between the left and right side end surfaces L and R. This is due to the presence of the metal films 12 and 12'.

Figure 4:
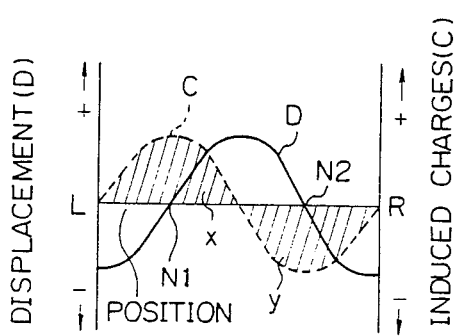
FIG. 4 is a graph representing the relationship between a displacement and induced charges of the longitudinal mode vibrator under the second order mode.

FIG. 4 is a graph representing the relationship between a displacement D and induced charges C of the longitudinal mode vibrator 10 under the second order mode. Under the second order mode, two nodes N1 and N2 are created. Charges are induced with both positive (+) and negative (−) polarities simultaneously on the same surface of the piezoelectric ceramic plate 11. Since the curve C varies in proportion to the distortion, the curve C can be derived by differentiating the curve D with respect to the position.

Figure 5:
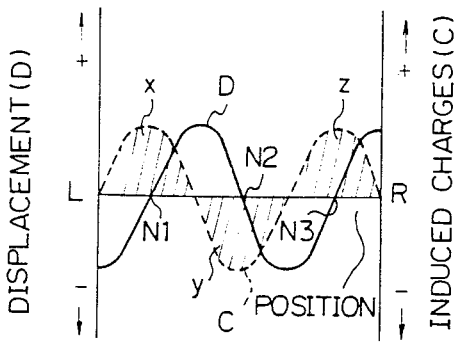
FIG. 5 is a graph representing the relationship between a displacement and induced charges of the longitudinal mode vibrator under the third order mode.

FIG. 5 is a graph representing the relationship between a displacement D and induced charges C of the longitudinal mode vibrator 10 under the third order mode. Under the third order mode, three nodes N1, N2, and N3 are created. The curve D and the curve C, obtained by differentiating the curve D, vary along the solid line curve and the broken line curve, as illustrated.

Figure 6:
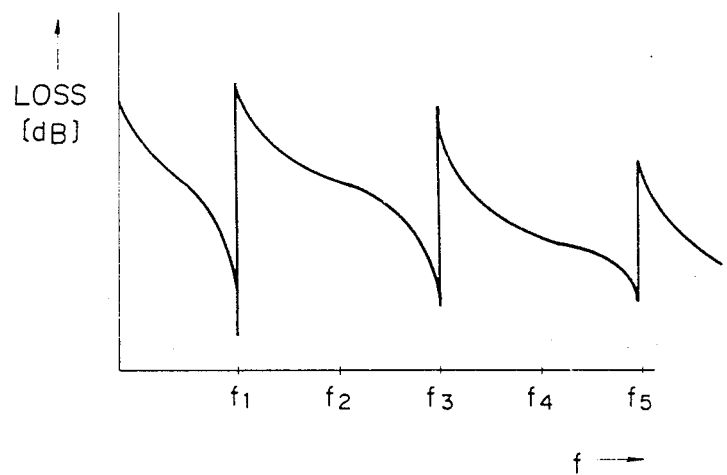
FIG. 6 is a graph depicting the frequency response characteristics of the longitudinal mode vibrator.

The longitudinal mode vibrator 10 is vibrated by the charges. Therefore, the frequency response characteristics thereof are dependent on the amount of the charges C. FIG. 6 is a graph depicting frequency response characteristics of the longitudinal mode vibrator 10. The abscissa indicates a frequency (f) and the ordinate a voltage attenuation loss (LOSS). In the graph, the sharp drop of the loss curve, at the resonance frequency $f_1$ is due to the aforesaid first order mode, corresponding to FIG. 3. A similar drop is also created at the resonance frequency $f_3$, due to the aforesaid third order mode, corresponding to FIG. 5. A similar drop due to the second order mode of FIG. 4 cannot be created at the related frequency $f_2$, as known from FIG. 6.

As previously mentioned, the first problem is that the piezoelectric ceramic vibrator exhibits no even number order mode frequency response. Thus, as shown in FIG. 6, no change occurs at, for example, the frequency $f_2$. The reason for this is that, as shown in FIG. 4, the positive (+) charges and the negative (−) charges are induced in the same amount. Therefore, these two charges cancel each other.

The second problem is that even though the piezoelectric ceramic vibrator exhibits a frequency response under all the odd number order modes, the higher the odd number, the lower the frequency response. Thus, as shown in FIG. 6, the loss at the frequency $f_3$ is larger than that of the frequency $f_1$, and the loss at the frequency $f_5$ is further larger than that of the preceding frequency $f_3$.

According to the present invention, the mechanical filter is composed of a plurality of polarized regions aligned with each other. Each two polarized regions are polarized in directions different from each other. Most preferably, each two adjacent polarized regions are polarized in directions opposite to each other.

Figure 7:
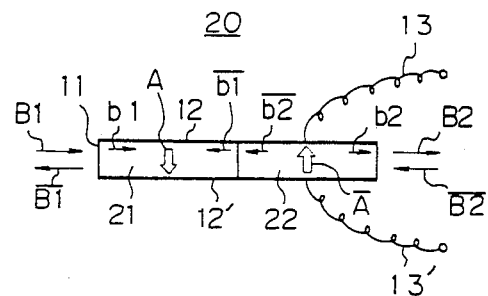
FIG. 7 is a front side view of the longitudinal mode vibrator according to a first embodiment of the present invention.

FIG. 7 is a front side view of the longitudinal mode vibrator according to a first embodiment of the present invention. A mechanical filter using the vibrator 20 of FIG. 7 can be driven under the second order mode. The longitudinal mode vibrator 20 of FIG. 7 is physically different from that shown in FIG. 2, however, is almost the same in perspective view as the vibrator 10 shown in FIG. 1. That is, the vibrator 20, like the vibrator 10, is basically comprised of a piezoelectric ceramic plate 11 which is, as a whole, polarized in its thickness direction and an electrode pair attached to its top and bottom surfaces to induce an AC electric field in that direction.

The vibrator 20 has, as illustrated in FIG. 7, a piezoelectric ceramic plate 11 which is divided lengthwise into two polarized regions 21 and 22. These polarized regions 21 and 22 are polarized, in advance, in their thickness directions opposite to each other, as shown by arrows A and $\overline{A}$. Due to the opposite polarizations of the regions 21 and 22, the vibrator 20 displays, as a whole, a longitudinal vibration mode in distortion which is different from that shown in FIG. 2. That is, one displacement (B1, B2) and the other displacement ($\overline{B1}$, $\overline{B2}$) occur alternately. For example, the displacement (B1, B2) is the resultant vector addition of the shrinkages (b1, $\overline{b1}$) occurring in the polarized region 21 and the elongations ($\overline{b1}$, b2) occurring in the polarized region 22. Similarly, the displacement ($\overline{B1}$, $\overline{B2}$) conversely is the resultant vector addition of the elongations occurring in the region 22 and the shrinkages occurring in the region 21. Thus, the operation of the vibrator 20 is quite different from that of the vibrator 10.

Figure 8:
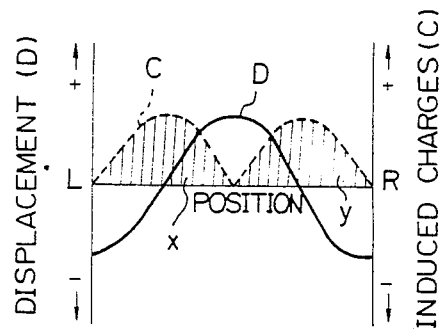
FIG. 8 is a graph representing the relationship between a displacement and induced charges of the longitudinal mode vibrator under the second order mode.

FIG. 8 is a graph representing the relationship between a displacement D and induced charges C of the longitudinal mode vibrator 20 under the second order mode. As understood from FIG. 8, considerable vibration is generated under the second order mode. This is due to the fact that, under the second order mode, the charges C are induced in the amount $(x+y)$, and not $(x-y)$, as in the same mode of FIG. 4. In this case, the amount $(x-y)$ is assumed to be approximately 0. Thus, the frequency response for the second order mode (same for the fourth order mode, the sixth order mode, and so on) can be ensured.

Figure 9:
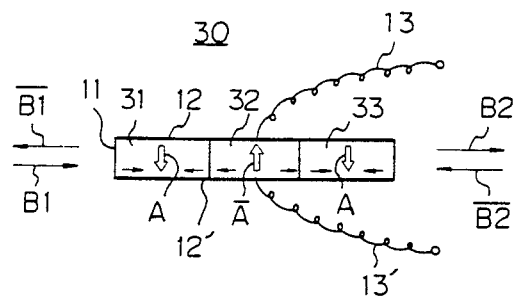
FIG. 9 is a front side view of the longitudinal mode vibrator according to a second embodiment of the present invention.

FIG. 9 is a front side view of the longitudinal mode vibrator according to a second embodiment of the present invention. A mechanical filter using the vibrator 30 of FIG. 9 can be driven under the third order mode. While this can also be obtained with a prior art mechanical filter, the mechanical filter using the vibrator 30 exhibits a higher frequency response. The longitudinal mode vibrator 30 of FIG. 9 is physically different from that shown in FIG. 2, however, is almost the same in perspective view as the vibrator 10 shown in FIG. 1. The vibrator 30 is, as illustrated in FIG. 9, divided lengthwise into three polarized regions 31, 32, and 33. These three polarized regions 31, 32, and 33 are processed, in advance, in such a manner that each two adjacent regions are polarized in their thickness directions opposite to each other, as shown by arrows A, $\overline{A}$, and A. At a certain timing, the elongations and shrinkages occur in the polarized regions in the directions of the small arrows. The vibrator 30 displays, as a whole, a longitudinal vibration mode in distortion as shown by the displacements $\overline{B1}$ and B2. The displacement (B1, $\overline{B2}$) and the displacement ($\overline{B1}$, B2) take place alternately. In the latter displacement ($\overline{B1}$, B2), the elongations and shrinkages occur in the directions opposite to those shown in FIG. 9. As a result, the operation of the vibrator 30 is quite different from the prior art vibrator under the third order mode, as shown in previous FIG. 5. This will be clarified with reference to FIG. 10.

Figure 10:
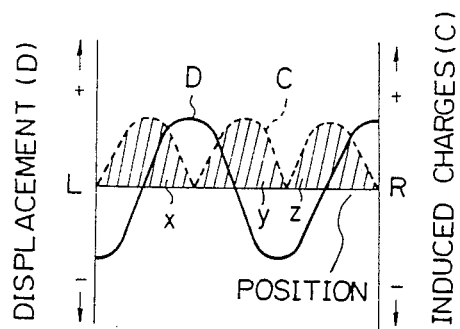
FIG. 10 is a graph representing the relationship between a displacement and induced charges of the longitudinal mode vibrator under the third order mode.

FIG. 10 is a graph representing the relationship between a displacement D and induced charges C of the longitudinal mode vibrator 30 under the third order mode. As shown in FIG. 10, the charges C are induced with the amount $(x+y+z)$, not $(x-y+z)$, which is equal to z, as in the same mode of FIG. 5. As a result, the frequency response for the third order mode is much higher than that of the prior art.

Figure 11:
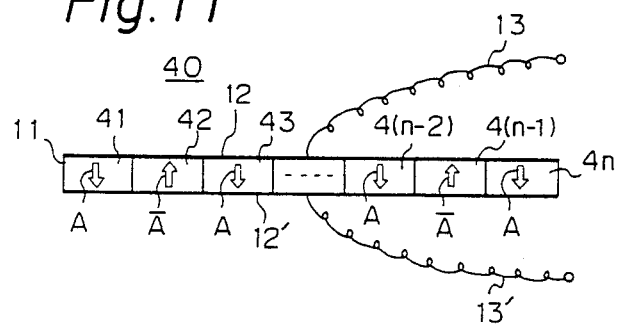
FIG. 11 is a front side view of the longitudinal mode vibrator according to a third embodiment of the present invention.

FIG. 11 is a front side view of the longitudinal mode vibrator according to a third embodiment of the present invention. A mechanical filter using the vibrator 40 of FIG. 11 can be driven under an n-th order mode. While this can also be obtained with the prior art mechanical filter if n is odd number, the frequency response of the prior art is very poor. It should be understood that the number n (positive integer) adopted in FIG. 11 is assumed to be equal to or larger than 4, as the cases where n=2 and n=3 were already illustrated in FIGS. 7 and 9. The vibrator 40 of FIG. 11 is physically different from that shown in FIG. 2, however, it is almost the same in perspective view as the vibrator 10 shown in FIG. 1. The vibrator 40 is divided lengthwise into n polarized regions 41, 42, 43 ... 4(n−2), 4(n−1), and 4n. These regions are polarized so that each two adjacent regions are polarized in opposite directions, as illustrated by the arrows A, $\overline{A}$, A ... A, $\overline{A}$ and A. In this case, the vibrator 40 exhibits a sharp frequency response at the frequency $f_n$, which is higher than $f_3$, such as $f_4$ and $f_5$.

Figure 12:
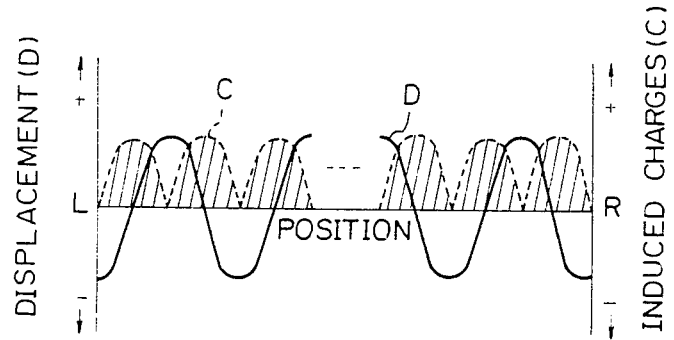
FIG. 12 is a graph representing the relationship between a displacement and induced charges of the longitudinal mode vibrator under the n-th order mode.

FIG. 12 is a graph representing the relationship between a displacement D and induced charges C of the longitudinal mode vibrator 40 under the n-th order mode. The graph may be read in the same way as the previous figures concerned.

Figure 13:
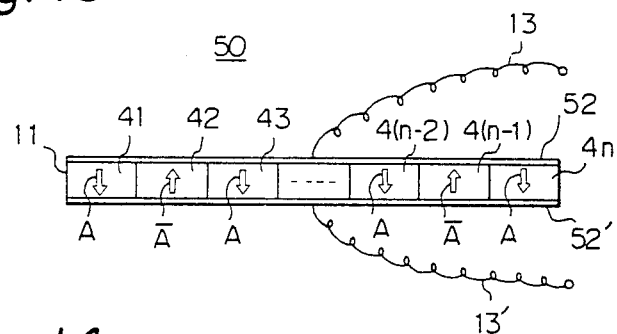
FIG. 13 is a front side view of the longitudinal mode vibrator according to a fourth embodiment of the present invention.

FIG. 13 is a front side view of the longitudinal mode vibrator according to a fourth embodiment of the present invention. The vibrator 50 of FIG. 13 is similar to that of FIG. 1 in perspective view. The vibrator 50 uses a strip-like electrode pair 52 and 52' made of a constant modulus alloy, instead of the metal films 12 and 12'. It is generally known that the frequency-temperature characteristics of the constant modulus alloy can be controlled by suitably selecting the heat processing temperature therefor. Thus, assuming that the piezoelectric ceramic plate has a positive frequency-temperature coefficient, the aforesaid heat processing temperature for the constant modulus alloy is selected so that the alloy exhibits a negative frequency-temperature coefficient. By this, a compound vibrator assembled with the ceramic plate and the constant modulus alloy exhibits a substantially zero frequency-temperature coefficient. Accordingly, temperature compensation can be attained by a compound vibrator assembled with a strip-like electrode pair 52 and 52' and the piezoelectric ceramic plate 11. In addition, the strip-like electrode pair 52, 52' made of the constant modulus alloy is advantageous from the viewpoint of mechanical strength in the connection between the leads 13, 13' and respective electrodes and in the connection, as usual, between both the coupler and the support wire and respective electrodes.

It should be understood that while a vibrator having constant modulus alloy members as its electrode pair is illustrated only in the case of driving under the n-th (n larger than 3) order mode, such a constant modulus alloy electrode pair can also be employed for the second order mode vibrator 20 of FIG. 7 and the third order mode vibrator 30 of FIG. 7.

As mentioned above, the mechanical filter of the present invention is comprised of, as its major part, at least one special vibrator as shown in FIGS. 7, 9, 11, and 13. The special characteristic resides in the polarized regions which are formed as one body. Taking the vibrator 20 of FIG. 7 as an example, the vibrator can be manufactured in two ways. One is to first prepare two polarized segments separately for the polarized regions 21 and 22, the segments being polarized in the same manner, in advance, in the thickness direction. The thus-polarized segments are then placed facing each other with opposite directions of polarization and adhered at the end surfaces. In this case, a suitable adhesive agent is used, such as "Araldite" produced by Ciba-Geigy Ltd.

Figure 14:
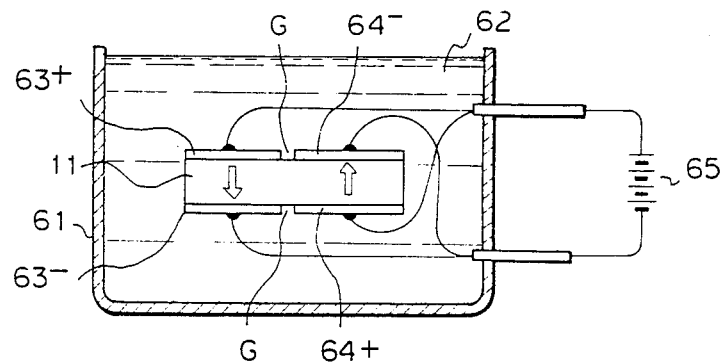
FIG. 14 shows the general construction of an apparatus for achieving the polarization of vibrators.

Another way is to prepare a nonpolarized ceramic plate first and then apply a high DC voltage to two different electrode pairs simultaneously with opposite polarity. FIG. 14 shows the general construction of an apparatus for achieving the polarizations of the vibrator 20. In FIG. 14, a nonpolarized piezoelectric ceramic plate 11 is placed inside a vessel 61 filled with a suitable insulation liquid 62, such as silicone oil. The ceramic plate 11 is supported and sandwiched by metal plates 63+, 63− and metal plates 64+, 64−. The metal plates 63+ and 64+ are led to a positive terminal of a high DC voltage source 65, while the metal plates 63− and 64− are led to a negative terminal thereof. In this case, the metal plates 63+ and 64− must be located with a certain gap G in order to prevent discharge therebetween. This gap G can be minimized by the use of the silicone oil. The above-mentioned layout also applies to the metal plates 63− and 64+. The piezoelectric ceramic plate 11, manufactured in the above-mentioned way, is preferable over that manufactured with the use of the adhesive agent in view of mechanical strength.

Figure 15:
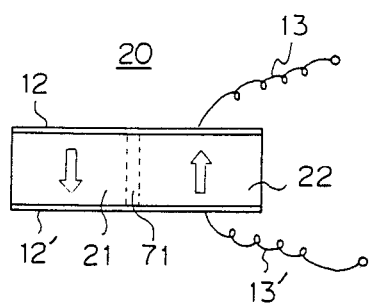
FIG. 15 is a front side view of a vibrator polarized with the use of the apparatus shown in FIG. 14.

FIG. 15 is a front side view of the vibrator 20 polarized with the use of the apparatus shown in FIG. 14. In FIG. 15, attention should be paid on the region 71. The region 71 is nonpolarized relative to the adjacent polarized regions 21 and 22. The nonpolarized region 71 is necessarily formed and inevitable due to the gaps G shown in FIG. 14. It may seem that such a nonpolarized region would have a deleterious effect on the vibrator 20, but, in actuality, the existence of the nonpolarized region 71 is beneficial, as clarified hereinafter. It should be understood that similar nonpolarized regions are also formed in the vibrators 30, 40, and 50, at portions sandwiched by each two adjacent polarized regions when these vibrators are polarized by the use of the apparatus shown in FIG. 14.

A mechanical filter using a vibrator having multipolarized regions, such as the regions 21, 22, 31, 32, and 33, is advantageous in the following way. Generally, the resonance frequency fr is expressed as $$fr = \frac{n}{2L} v$$

where n denotes the order of the aforesaid vibration mode, such as the second order mode (n=2) and third order mode (n=3), L denotes the length of the vibrator, and v denotes the velocity of sound. The velocity v is expressed as $$v = \sqrt{\frac{C}{\rho}}$$

where $\rho$ denotes the density of the material composing the vibrator and C denotes the elastic coefficient. It is known from the above recited equations that, to obtain a desired value of the resonance frequency fr, a suitable length L must be determined, because the other values n, C, and $\rho$ are predetermined and constant. In other words, the resonance frequency fr can be varied only by the length L. This makes it troublesome to obtain a mechanical filter of specific lengths.

Consider the mechanical filters for INS and ISDN. In the INS, the bit rate is prescribed as 200 kb/s (bit/-second). In ISDN, the bit rate is prescribed as 320 kb/s. Thus, the resonance frequency fr of the filter for the INS must be 200 kHz, and the resonance frequency fr' of the filter for ISDN must be 320 kHz, whereby the expression fr'=1.6 fr approximately stands. This means that the length L' of a vibrator 10 (FIGS. 1 and 2) for the ISDN would be $$\frac{1}{1.6}$$

times the length L of vibrator 10 for the INS. To be specific, since the length L for the INS is usually 13 mm, the length L' for the ISDN is to be a short 8.13 mm. Such a vibrator is too short to be manufactured easily.

Here, reconsidering the above recited equation $$fr = \frac{n}{2L} v,$$

it will be found that the length L' for the ISDN can be as long as the length L for the INS by utilizing the second order mode (n=2). in this case, $$L' = \frac{2}{2fr'} v$$

stands for the ISDN. By using the relationship fr'=1.6 fr, this can be rewritten as $$L' = \frac{2}{2 \times 1.6 fr} v.$$

Accordingly, when the vibrator 20 (FIG. 7 or FIG. 15) of the second order mode is used, the length L' for the ISDN can be as long as the length $$L\left(=\frac{1}{2 \times fr} v\right)$$

for the INS, since the length L' is approximately $$\frac{2}{1.6} L (= 1.25L).$$

Therefore, a vibrator of 16.25 mm in length is possible for the ISDN, which is much longer than the aforesaid 8.13 mm. Such a transformation of length is impossible with the prior art vibrator, because it cannot be driven under the second order mode (n=2).

The second order mode vibrator 20 will be further analyzed below, since vibrators of the second order mode are considered to be more available commercially than the third order mode or more. Further, the second order mode vibrator 20 can exhibit a wide band characteristic, for example, a fractional band width over 1%, and also a good characteristic in spurious suppression, for example, an effective loss over 30 dB up to the frequency of 1.5 MHz. Such severe requirements cannot be satisfied by the prior art mechanical filter itself: it can only be satisfied with additional electric matching circuits which cooperate with the mechanical filter at its input and output sides.

Figure 16:
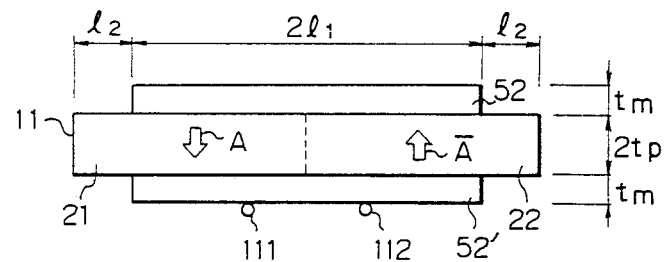
FIG. 16 is a front side view of the longitudinal mode vibrator according to a fifth embodiment of the present invention.
Figure 17:
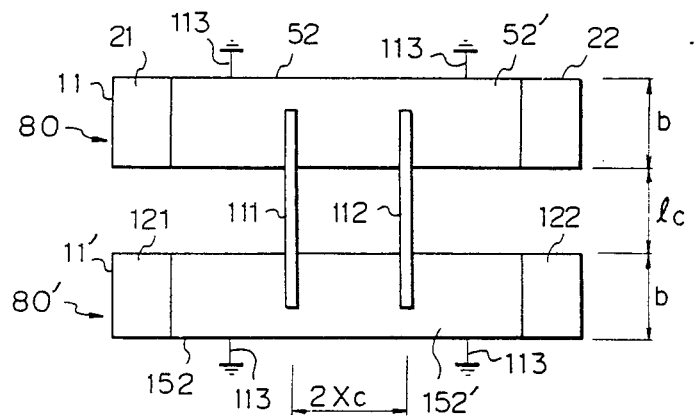
FIG. 17 is a bottom view of a mechanical filter using the vibrators having the configuration, in the front side view, shown in FIG. 16.

FIG. 16 is a front side view of the longitudinal mode vibrator according to a fifth embodiment of the present invention. FIG. 17 is a bottom view of a mechanical filter using vibrators having a configuration, in the front side view, as shown in FIG. 16. In FIG. 16, a vibrator 80 is comprised of polarized regions 21, 22 and an electrode pair 52 and 52' made of a constant modulus alloy, as in FIG. 13. The electrodes 52 and 52' are secured to the top and bottom surface of the piezoelectric ceramic plate 11 by a soldering technique. The vibrator 80' is identical to the vibrator 80. That is, the vibrator 80' is comprised of a piezoelectric ceramic plate 11', as a base, two polarized regions 121 and 122, and an electrode pair 152 and 152' made of a constant modulus alloy. The two compound vibrators 80 and 80' are mechanically coupled by couplers 111 and 112. The first and second couplers are located respectively at a first intermediate position between a first nodal point under the fourth order mode and a first nodal point under the sixth order mode and a second intermediate position between a second nodal point under the fourth order mode and a second nodal point under the sixth order mode. In this case, both the fourth and sixth order mode vibrations to be driven by the couplers are weakened, and therefore, the spurious mode can be suppressed. Further, the vibrators 80 and 80' are mechanically supported with respect to a suitable base by way of support wires 113 at the nodal points created under the second order mode. The couplers and the support wires themselves are commonly known, so no detailed explanation will be given therefor.

As illustrated in FIGS. 16 and 17, the electrode pair 52 and 52' of the vibrator 80 has a shorter length than the piezoelectric ceramic plate 11. Further, the individual centers thereof are aligned with each other. This is also true of the other vibrator 80'. Such a shorter electrode pair has two advantages. First, there is good spurious mode suppression. Second, adjustment of the resonance frequency is very easy. That is, since the piezoelectric ceramic plate is not wholly covered with the electrode pair, the exposed end surfaces of the ceramic plate can smoothly be worn away by a suitable etching machine. Such shortened lengths are expressed as characters $l_2$ in FIG. 16, while the length of each of the electrodes 52 and 52' is expressed as $2l_1$. Thus, the length of the ceramic plate 11 (11') is equal to ($2l_1+2l_2$). Further, the thickness of each of the electrodes 52 and 52' of the vibrator 80 is $t_m$, the thickness of the ceramic plate 11 is $2t_p$, and the width thereof is b. These conditions also apply to the vibrator 80'. The vibrators 80 and 80' are separated by a pitch $l_c$ and bridged by the couplers 111 and 112. According to the best mode, each of the electrodes 52 and 52' (same for the electrodes 152 and 152') is selected to have a length $2l_1$, i.e., 0.80 to 0.84 time the length of the piezoelectric ceramic plate 11, i.e., $2l_1+2l_2$.

When an AC voltage of a predetermined frequency is applied to the electrode pair 52, 52' via the aforesaid leads 13 and 13' (not shown in FIGS. 16 and 17), the vibrator 80 is vibrated under the second order mode, because the vibrator 80 is set up with two regions 21 and 22 with different polarization directions.

Figure 18:
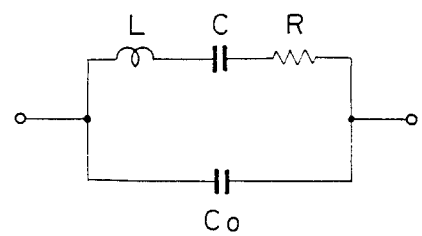
FIG. 18 is an equivalent circuit diagram of the longitudinal mode vibrator shown in FIG. 16.

FIG. 18 is an equivalent circuit diagram of the longitudinal mode vibrator shown in FIG. 16. The equivalent circuit diagram stands at near the resonance frequency. In FIG. 18, the character L denotes an equivalent series inductance, C an equivalent series capacitance, R an equivalent resistance, and $C_0$ an equivalent parallel capacitance. Here, the capacitance ratio $\gamma$ is defined as $C_0/C$, which capacitance ratio $\gamma$ can be used as an estimation of a frequency response, i.e., a band width. The smaller the value of $\gamma$, the stronger the vibration of the vibrator. Conversely, the larger the value of $\gamma$, the larger the suppression of the frequency response.

Figure 19:
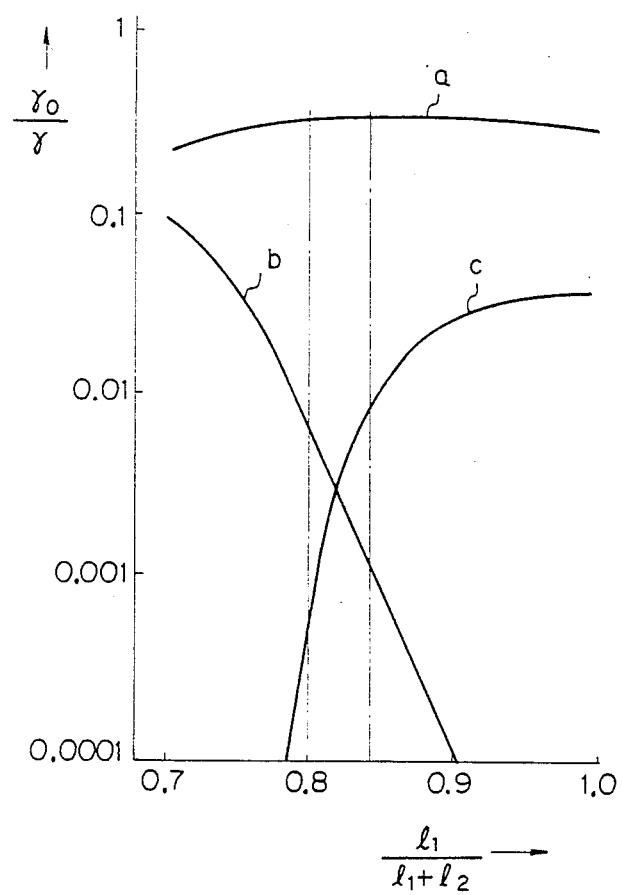
FIG. 19 is a graph representing the data obtained through calculation of the capacitance ratios $\gamma$ under the second, fourth, and sixth order modes.

FIG. 19 is a graph representing data obtained through calculation of the capacitance ratios $\gamma$ under the second, fourth, and sixth order modes. The abscissa indicates the length $2l_1$ of each electrode (52, 52'), and the ordinate indicates the capacitance ratio $\gamma$, both of the vibrator 80. However, the variables along the abscissa and ordinate are normalized with, respectively, the length ($2l_1+2l_2$) of the piezoelectric ceramic plate 11 and the capacitance ratio $\gamma_0$ of the ceramic plate 11 alone. The curves a, b, and c represent data obtained under the second, fourth, and sixth order modes, respectively.

As recognized from the graph, under the second order mode, the capacitance ratio $\gamma$ is maintained substantially constant with respect to the variation of the length of the electrode pair (52, 52'). Conversely, under the fourth and sixth order modes, the capacitance ratios $\gamma$ are greatly varied with respect to the length of the electrode pair (52, 52'). For example, under the fourth order mode (curve b), the capacitance ratio $\gamma$ increases along with the increase of the length ($2l_1$) of the electrode pair (52, 52'). Conversely, under the sixth order mode (curve c), the capacitance ratio $\gamma$ decreases along with the increase of the length ($2l_1$). Thus, the capacitance ratios $\gamma$, under both the fourth and sixth order modes, reach the same value at a certain length of the electrode pair (52, 52'). The "same value" is 0.82 from the graph in terms of $$\frac{l_1}{l_1+l_2}.$$

In this regard, when the lengths of the electrode pairs (52, 52', 152, 152') are determined to be k (k is on the order of 0.80 to 0.84) times the lengths of the corresponding piezoelectric ceramic plates (11, 11'), the thus-determined mechanical filter exhibits capacitance ratios $\gamma$ under both the fourth and sixth order modes, about 100 times the ratio $\gamma$ under the second order mode. In such a mechanical filter, undesired fourth and sixth order mode vibrations can be sufficiently suppressed, while the required second order mode vibration is left as is. If the value of $$\frac{l_1}{l_1+l_2}$$

is selected to be outside the range of the aforesaid k (0.80 to 0.84), the capacitance ratio $\gamma$ produced under either one of the fourth or sixth order mode would become too small to sufficiently suppress the spurious modes.

Figure 20:
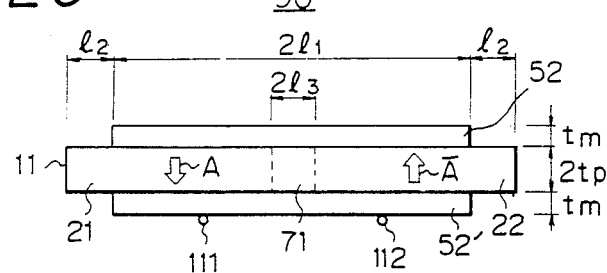
FIG. 20 is a front side view of the longitudinal mode vibrator according to a sixth embodiment of the present invention.

FIG. 20 is a front side view of the longitudinal mode vibrator according to a sixth embodiment of the present invention. In FIG. 20, the vibrator 90 is manufactured by the use of the apparatus shown in FIG. 14. Therefore, the piezoelectric ceramic plate 11 has, at its center part, a nonpolarized region 71 (refer also to FIG. 15) in addition to the polarized regions 21 and 22. As previously mentioned, the nonpolarized region 71 has some deleterious effects, but also some preferable effects, as will be clarified with reference to FIG. 21. The length of the nonpolarized region 71 is represented in FIG. 20 by the character $l_3$. The value of $l_3$ is most preferably determined such that $$\frac{l_3}{l_1 + l_2} = m,$$

where m is on the order of 0.13 through 0.15.

Figure 21:
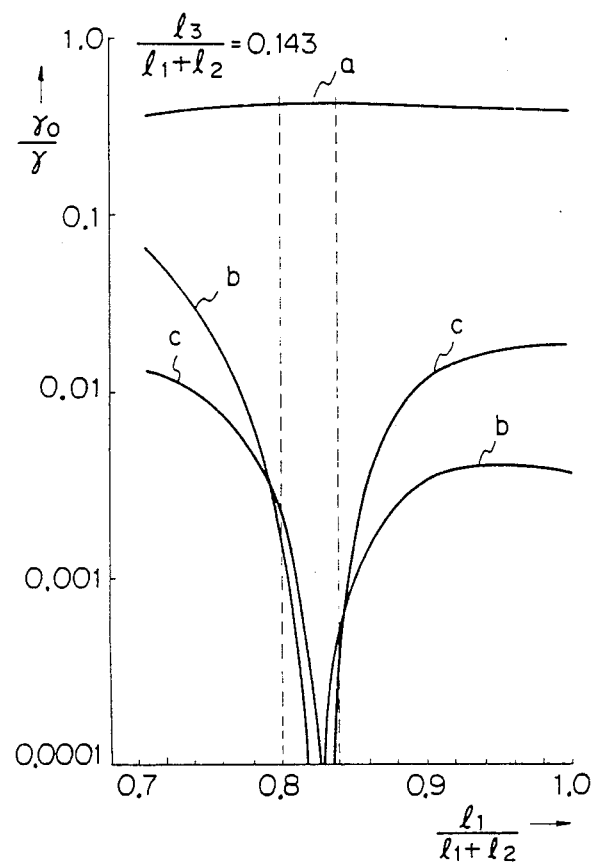
FIG. 21 is a graph representing the data obtained through calculation of the capacitance ratios $\gamma$ under the second, fourth, and sixth order modes.

FIG. 21 is a graph representing data obtained through calculation of the capacitance ratio $\gamma$ under the second, fourth, and sixth order modes. The graph may be read in the same way as that of FIG. 19. The curves a, b, and c, corresponding to the second, fourth, and sixth order modes, respectively, are obtained in the case where the aforesaid value m is predetermined as 0.143 among the values 0.13 through 0.15. In the case of $$\frac{l_3}{l_1 + l_2} = 0.143,$$

the capacitance ratios $\gamma$, under both the fourth and sixth order modes, become very large compared to the case of FIG. 19 (using the vibrator 80 having no nonpolarized region). As seen from the graph of FIG. 21, the large capacitance ratios $\gamma$ of the curves b and c are obtained simultaneously at the condition where $$\frac{l_1}{l_1 + l_2}$$

is selected to be equal to the aforesaid value k, i.e., 0.80 through 0.84. To be specific, each of the capacitance ratios $\gamma$ of the fourth and sixth order modes is about 10,000 times the ratio $\gamma$ of the second order mode. Accordingly, a mechanical filter having the vibrator 90 of FIG. 20 exhibits a larger suppression capability in both the fourth and sixth order modes than a mechanical filter having the vibrator 80 of FIG. 16.

Figure 22:
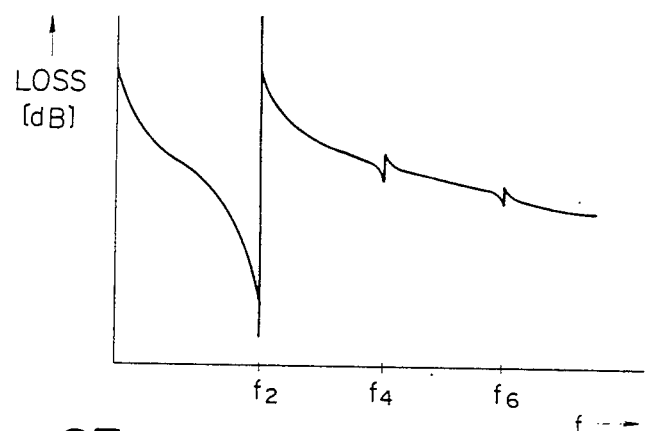
FIG. 22 is a graph depicting the frequency response characteristics of the longitudinal mode vibrator shown in FIG. 16.

FIG. 22 is a graph of the frequency response characteristics of the longitudinal mode vibrator 80 shown in FIG. 16. The data of the graph is obtained with a vibrator 80 with the dimensions (see FIGS. 16 and 17) displayed in the following Table I.

TABLE I

| Total length | 14.00 |
|---|---|
| $2l_1$ | 11.40 |
| $2l_2$ | 2.60 |
| $l_2/l_1$ | 0.228 |
| $t_m$ | 0.25 |
| $2t_p$ | 0.5 |
| $t_m/t_p$ | 1 |
| b | 1.0 |

The vibrator 80 having the dimensions shown in Table I exhibits the curve of FIG. 22, from which it is found that the undesired vibration under the fourth and sixth order modes can sufficiently be supporessed at the frequencies $f_4$ and $f_6$, respectively.

Finally, several examples will be disclosed. Two prototype mechanical filters $MF_1$ and $MF_2$ exhibit equivalent constants under the second order mode, as shown in the following Table II.

TABLE II

| | $MF_1$ | $MF_2$ |
|---|---|---|
| $f_2$ (kHz) | 320.035 | 320.039 |
| L (mH) | 54.72 | 59.10 |
| C (pF) | 4.50 | 4.17 |
| R ($\Omega$) | 43.67 | 36.76 |
| Q | 3184.0 | 3368.0 |
| Cd (pF) | 216.0 | 210.0 |
| $\gamma$ | 47.96 | 50.40 |

As seen from Table II, each mechanical filter has a small capacitance ratio $\gamma$. Therefore, strong vibration can be obtained at the resonance frequency in the 320 kHz band. In this case, the couplers 111 and 112 (refer to FIGS. 16 and 17) are located at, respectively, a first intermediate position between a first nodal point under the fourth order mode and a first nodal point under the sixth order mode and a second intermediate position between a second nodal point under the fourth order mode and a second nodal point under the sixth order mode. Usually, the coupler is located just at the nodal point of the undesired mode. In the present invention, however, since two modes must be suppressed at the same time, each of the couplers is located at the position as described above. In each of the above examples, the distance $X_c$ (refer to FIG. 17) between the couplers 111 and 112 is selected as 3.4 mm. Therefore, the value of $$\frac{X_c}{l_1 + l_2}$$

is calculated to be 0.243.

Figure 23:
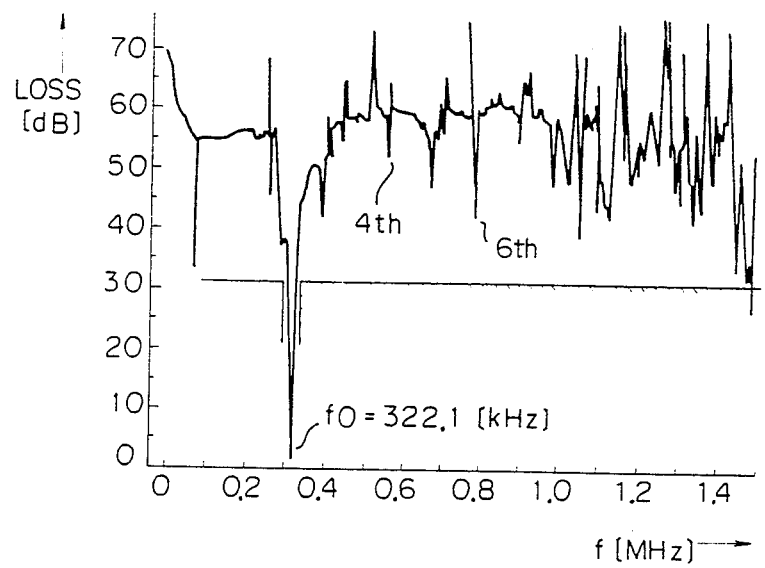
FIG. 23 is a graph depicting the frequency response characteristics of one example of a mechanical filter according to the present invention.

FIG. 23 is a graph of the frequency response characteristics of one example of a mechanical filter according to the present invention. The mechanical filter is constructed with the layout as shown in FIG. 17 and the dimensions shown in Table I. Further, the distance $X_c$ is set as 1.7 mm, so that the resonance frequency ($f_0$) becomes 322.1 kHz. In the graph, the characteristics referenced by the characters 4th and 6th indicate the fourth and sixth order mode frequency response, respectively. These undesired mode responses can fully be suppressed. Furthermore, the loss can be 30 dB and up over the wide frequency band reaching 1.5 MHz.

Figure 24:
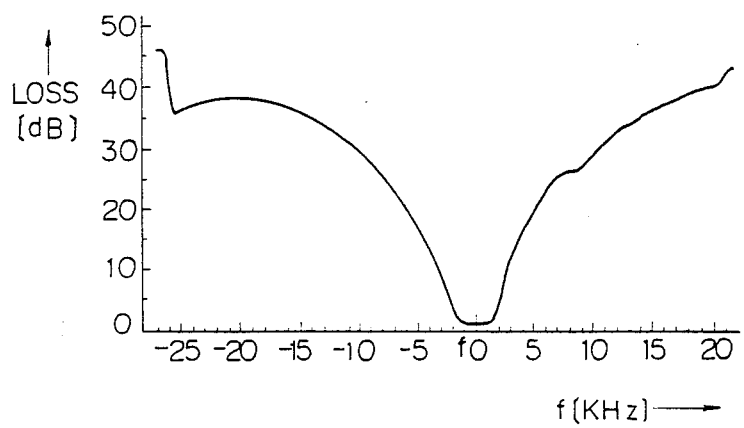
FIG. 24 is a graph depicting the frequency response characteristics of the mechanical filter exhibiting the characteristics shown in the graph of FIG. 23, measured in the pass band, defined by $f_0$, as the center frequency, and its neighboring frequencies.

FIG. 24 is a graph of the frequency response characteristics of the mechanical filter exhibiting the graph of FIG. 23, measured in the pass band, defined by $f_0$, as the center frequency, and its neighboring frequencies. It can be read from the graph of FIG. 24 that a wide band characteristic can be ensured having a fractional band width over 1%.

Figure 25:
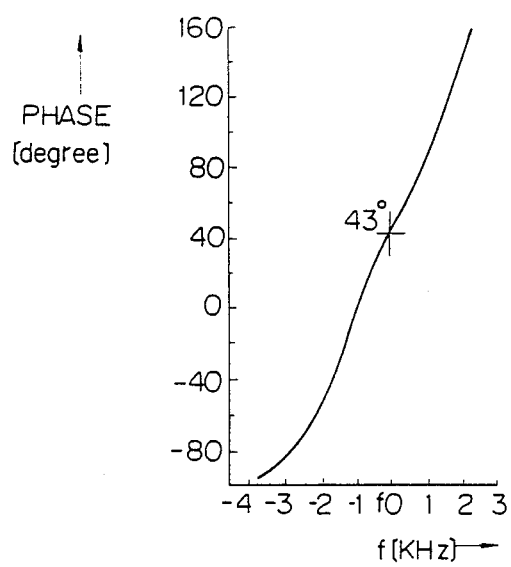
FIG. 25 is a graph depicting characteristics in phase using the mechanical filter exhibiting the characteristics shown in the graphs of FIGS. 23 and 24, measured in the pass band, defined by $f_0$, as the center frequency, and its neighboring frequencies.

FIG. 25 is a graph of the characteristics in phase using the mechanical filter exhibiting the graphs of FIGS. 23 and 24, measured in the pass band, defined by $f_0$, as the center frequency, and its neighboring frequencies. As clear from the graph of FIG. 25, the variation in phase has good linearity.

Figure 26:
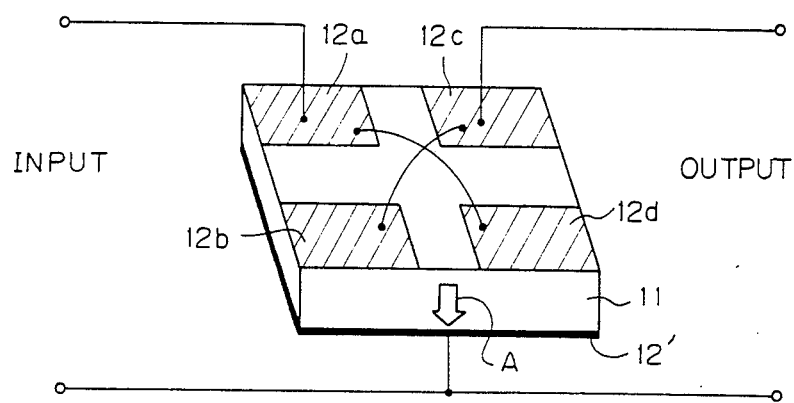
FIG. 26 is a perspective view of a prior art mechanical filter using a single piezoelectric ceramic vibrator.

As mentioned previously in the introduction of the description, the present invention relates to a mechanical filter including at least one piezoelectric ceramic vibrator. This means that the mechanical filter may be comprised of a single piezoelectric ceramic vibrator. FIG. 26 is a perspective view of a prior art mechanical filter comprised of a single piezoelectric ceramic vibrator. The members 11, 12', and 12 (12a through 12d) are identical to those having the same reference numerals mentioned previously. The single vibrator type filter of FIG. 26 has four divisional metal films 12a through 12d (hatchings are employed not for representing region of cross-sections, as usual, but for facilitating understanding of the distinctions of the four films). The divisional metal films are connected by two wire bondings, as illustrated. The filter of this type is known from, for example, "THE JOURNAL OF THE INSTITUTE OF ELECTRONICS AND COMMUNICATION ENGINEERS OF JAPAN", (hereinafter the IECEJ journal) Vol. 53-A, No. 4 FIG. 2 on page 178, published on April 1970.

Figure 27:
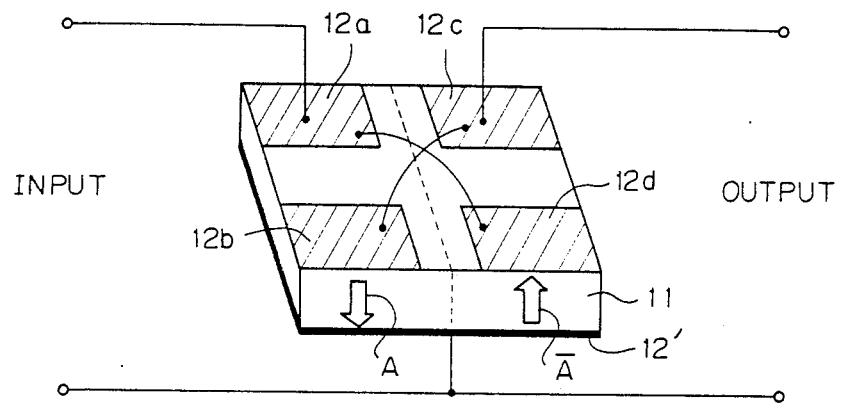
FIG. 27 is a perspective view of a mechanical filter according to the present invention using a single vibrator.

FIG. 27 is a perspective view of a mechanical filter comprised of a single piezoelectric ceramic vibrator according to a seventh embodiment of the present invention. The difference here is that the piezoelectric ceramic plate 11 is divided into two regions. The two regions are polarized in opposite directions, as shown by arrows A and $\overline{A}$.

The filter shown in FIG. 26 is a multimode filter, driven under both a longitudinal vibration mode of the first order and a bend vibration mode of the second order. The filter has the four divisional metal films 12a through 12d on its upper side and a common electrode 12' on its bottom side. The input signal is given to the electrodes 12a and 12d, and, thus, the longitudinal mode vibration is induced. Then, the longitudinal mode vibration generates further the bend mode vibration, and the electrodes 12b and 12c produce the filtered output signal due to a coupling of these two mode vibrations. In this case, the frequency of the longitudinal mode and the frequency of the bend mode must coincide with each other. That is, the filter must be driven under the so-called degeneration mode. In FIG. 3 of the IECEJ journal Vol. 53-A, No. 4, the second order longitudinal mode vibration is also generated. Due to the second order longitudinal mode vibration it is necessarily difficult to obtain a good filter characteristic, because a relatively large loss is created under this second order longitudinal vibration mode.

However, it is possible for the filter of FIG. 27 to utilize the high order mode vibration, as explained before, due to the divisional vibrators polarized in opposite directions with each other. In this case it is also necessary to drive the filter of FIG. 27 at a conditional point to which both the longitudinal mode of high order and bend mode are degenerated.

As mentioned above in detail, the present invention makes it possible to realize a mechanical filter which can be driven under various vibration modes irrespective of the even number order mode and the odd number order mode. In addition, the mechanical filter designed to be driven under the high number order mode can still maintain almost the same filtering capability as that of the mechanical filter designed to be driven under the low number order mode. In practice, the mechanical filter of the present invention may preferably be used in a digital transmission system for setting up an ISDN having a bit rate of 320 kHz.

We claim:

1. A mechanical filter including at least one vibrator, comprising:
    a piezoelectric ceramic plate, formed as a rectangular parallelepiped with mutually perpendicular length, width and thickness axes, polarized substantially along the thickness axis, said piezoelectric ceramic plate divided along the length axis into a plurality of polarized regions aligned with each other, each two adjacent regions polarized in different directions; and
    an electrode pair, attached to opposing surface of said piezoelectric ceramic plate substantially perpendicular to the thickness axis, for inducing an alternating current electric field therebetween, both electrodes in said electrode pair contacting more than one of said polarized regions and said at least one vibrator vibrating in a longitudinal mode by compression and elongation along the length axis.

2. A mechanical filter as set forth in claim 1, wherein each said two adjacent regions are polarized in opposite directions.

3. A mechanical filter as set forth in claim 2, wherein each electrode in said electrode pair is made of metal film.

4. A mechanical filter as set forth in claim 2, wherein each electrode in said electrode pair is made of a constant modulus alloy and forms a strip-like electrode.

5. A mechanical filter as set forth in claim 4, wherein a non-unitary positive integer number n of said polarized regions are formed in said piezoelectric ceramic plate and said mechanical filter provides a filtering function driven under an n-th order mode.

6. A mechanical filter as set forth in claim 5,
    wherein said piezoelectric ceramic plate and said electrode pair have centers, and
    wherein said electrode pair is shorter along the length axis than said piezoelectric ceramic plate and the centers thereof are aligned with each other.

7. A mechanical filter as set forth in claim 6,
    wherein two identical vibrators are employed, each being driven under a second order mode due to said polarized regions being two in number, and
    wherein said mechanical filter further comprises a first coupler and a second coupler, respectively coupling said identical vibrators at a first intermediate position between a first nodal point under the fourth order mode and a first nodal point under the sixth order mode, and a second intermediate position between a second nodal point under the fourth order mode and a second nodal point under the sixth order mode.

8. A mechanical filter as set forth in claim 7, wherein, in each of said identical vibrators, said electrode pair has a width substantially identical to that of said piezoelectric ceramic plate and a length k times that of said piezoelectric ceramic plate, where k is between 0.80 and 0.84.

9. A mechanical filter as set forth in claim 2, wherein an even positive integer number n of said polarized regions are formed in said piezoelectric ceramic plate and said mechanical filter provides a filtering function driven under an n-th order mode.

10. A mechanical filter as set forth in claim 1,
    wherein each said two adjacent regions are polarized in opposite directions, and
    wherein said piezoelectric ceramic plate includes a nonpolarized region separating each said two adjacent regions in the length direction.

11. A mechanical filter as set forth in claim 10, wherein each electrode in said electrode pair is made of metal film.

12. A mechanical filter as set forth in claim 10, wherein each electrode in said electrode pair is made of a constant modulus alloy and forms a strip-like electrode.

13. A mechanical filter as set forth in claim 12, wherein non-unitary positive integer number n of said polarized regions are formed in said piezoelectric ceramic plate and said mechanical filter provides a filtering function driven under an nth order mode.

14. A mechanical filter as set forth in claim 13,
wherein said piezoelectric ceramic plate and said electrode pair have centers, and
wherein said electrode pair is shorter along the length axis than said piezoelectric ceramic plate and the centers thereof are aligned with each other.

15. A mechanical filter as set forth in claim 14,
wherein two identical vibrators are employed, each being driven under a second order mode due to said polarized regions being two in number, and
wherein said mechanical filter further comprises a first coupler and a second coupler, respectively coupling said identical vibrators at a first intermediate position between a first nodal point under the fourth order mode and a first nodal point under the sixth order mode, and a second intermediate position between a second nodal point under the fourth order mode and a second nodal point under the sixth order mode.

16. A mechanical filter as set forth in claim 15, wherein, in each of said identical vibrators, said electrode pair has a width substantially identical to that of the said piezoelectric ceramic plate and a length k times that of said piezoelectric ceramic plate, where k is between 0.80 and 0.84.

17. A mechanical filter including a least one vibrator, comprising:
a piezoelectric ceramic plate, formed as a rectangular parallelepiped with mutually perpendicular length, width and thickness axes, having two substantially adjacent regions polarized in opposite directions along the thickness axis and dividing said piezoelectric ceramic plate along the length axis;
a common electrode formed on a first surface substantially perpendicular to the thickness axis;
four opposing electrodes formed on a second surface opposite the first surface, each of said four opposing electrodes formed in a different corner of the second surface; and
means for supplying alternating current to said common and four opposing electrodes to form an electric field therebetween to vibrate said piezoelectric ceramic plate in both a longitudinal mode, along the length axis, and a flexural mode.

* * * * *